United States Patent
Chuang et al.

(10) Patent No.: US 9,673,246 B2
(45) Date of Patent: Jun. 6, 2017

(54) DUAL METAL FOR A BACKSIDE PACKAGE OF BACKSIDE ILLUMINATED IMAGE SENSOR

(71) Applicant: TAIWAN SEMICONDUCTOR MANUFACTURING COMPANY, LTD., Hsin-Chu (TW)

(72) Inventors: Chun-Chieh Chuang, Tainan (TW); Dun-Nian Yaung, Taipei (TW); Jen-Cheng Liu, Hsin-Chu (TW); Wen-De Wang, Minsyong Township, Chiayi County (TW); Jhy-Ming Hung, Dacun Township, Changhua County (TW); Pao-Tung Chen, Hsin Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 13/644,783

(22) Filed: Oct. 4, 2012

(65) Prior Publication Data

US 2013/0026467 A1  Jan. 31, 2013

Related U.S. Application Data

(63) Continuation of application No. 12/356,968, filed on Jan. 21, 2009, now Pat. No. 8,293,122.

(51) Int. Cl.
*H01L 27/146* (2006.01)
*H01L 23/00* (2006.01)

(52) U.S. Cl.
CPC ........ *H01L 27/14636* (2013.01); *H01L 24/82* (2013.01); *H01L 27/1464* (2013.01); *H01L 27/14632* (2013.01); *H01L 27/14687* (2013.01); *H01L 2924/01005* (2013.01); *H01L 2924/01006* (2013.01); *H01L 2924/01013* (2013.01); *H01L 2924/01019* (2013.01); *H01L 2924/01029* (2013.01); *H01L 2924/01032* (2013.01);

(Continued)

(58) Field of Classification Search
CPC .................................. H01L 27/14636
USPC ........................... 257/324, 48, 433
See application file for complete search history.

(56) References Cited

U.S. PATENT DOCUMENTS 6,881,631 B2  4/2005  Saito et al.
7,101,726 B2  9/2006  Yamamoto et al.
(Continued)

*Primary Examiner* — Mark Prenty
(74) *Attorney, Agent, or Firm* — Haynes and Boone, LLP

(57) ABSTRACT

A method for fabricating a semiconductor device with improved bonding ability is disclosed. The method comprises providing a substrate having a front surface and a back surface; forming one or more sensor elements on the front surface of the substrate; forming one or more metallization layers over the front surface of the substrate, wherein forming a first metallization layer comprises forming a first conductive layer over the front surface of the substrate; removing the first conductive layer from a first region of the substrate; forming a second conductive layer over the front surface of the substrate; and removing portions of the second conductive layer from the first region and a second region of the substrate, wherein the first metallization layer in the first region comprises the second conductive layer and the first metallization layer in the second region comprises the first conductive layer and the second conductive layer.

20 Claims, 9 Drawing Sheets

(52) U.S. Cl.
CPC ............... *H01L 2924/01033* (2013.01); *H01L 2924/01049* (2013.01); *H01L 2924/01073* (2013.01); *H01L 2924/01074* (2013.01); *H01L 2924/01078* (2013.01); *H01L 2924/01082* (2013.01); *H01L 2924/04941* (2013.01); *H01L 2924/10329* (2013.01); *H01L 2924/10336* (2013.01); *H01L 2924/14* (2013.01); *H01L 2924/30105* (2013.01)

(56) References Cited

U.S. PATENT DOCUMENTS

| | | | |
|---|---|---|---|
| 7,354,830 B2* | 4/2008 | Lin et al. | 438/275 |
| 7,659,595 B2* | 2/2010 | Shiau et al. | 257/459 |
| 7,937,380 B2* | 5/2011 | Spiegelman et al. | 707/705 |
| 7,973,380 B2* | 7/2011 | Hsu et al. | 257/460 |
| 2007/0085212 A1* | 4/2007 | Mao et al. | 257/758 |
| 2007/0117253 A1* | 5/2007 | Hsu | H01L 27/14618 438/75 |
| 2009/0185060 A1* | 7/2009 | Akiyama | H01L 27/14623 348/294 |
| 2010/0091149 A1* | 4/2010 | Weisfield et al. | 348/294 |
| 2010/0144134 A1* | 6/2010 | Won | 438/592 |

\* cited by examiner

DUAL METAL FOR A BACKSIDE PACKAGE OF BACKSIDE ILLUMINATED IMAGE SENSOR

This application is a continuation of U.S. Ser. No. 12/356,968 filed Jan. 21, 2009, and entitled, "Dual Metal For A Backside Package of Backside Illuminated Image Sensor," the disclosure of which is hereby incorporated by reference in its entirety.

BACKGROUND

An image sensor provides a grid of pixels, such as photosensitive diodes or photodiodes, reset transistors, source follower transistors, pinned layer photodiodes, non-pinned layer photodiodes, and/or transfer transistors, for recording an intensity or brightness of light. The pixel responds to the light by accumulating a charge—the more light, the higher the charge. The charge can be processed by another circuit so that a color and brightness can be used for a suitable application, such as a digital camera. Common types of pixel grids include a charge-coupled device (CCD) or complimentary metal oxide semiconductor (CMOS) image sensor.

Backside illuminated sensors are used for sensing a volume of exposed light projected towards a back surface of a substrate. Backside illuminated sensors provide a high fill factor and reduced destructive interference, as compared to front-side illuminated sensors. The pixels are located on a front side of the substrate, and the substrate is thin enough so that light radiation projected towards the backside of the substrate can reach the pixels. Due to the thinned substrate, a supplemental device (e.g., a carrier wafer) is typically attached to the front surface of the substrate on which one or more sensor elements are fabricated. Since such supplemental devices block or prevent ready access to the bond pads of individual sensor elements, the back surface of the substrate is often processed to form an opening providing access to bond pads of the individual sensor elements. It has been observed that bondability to these bond pads is inadequate. Various methods have been introduced to improve bondability by increasing the thickness of the bond pad layers where the bonding occurs; however, such methods are costly, often complicate processing, and/or decrease sensor element performance.

Accordingly, what is needed is a method for manufacturing a backside illuminated sensor device that addresses the above stated issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
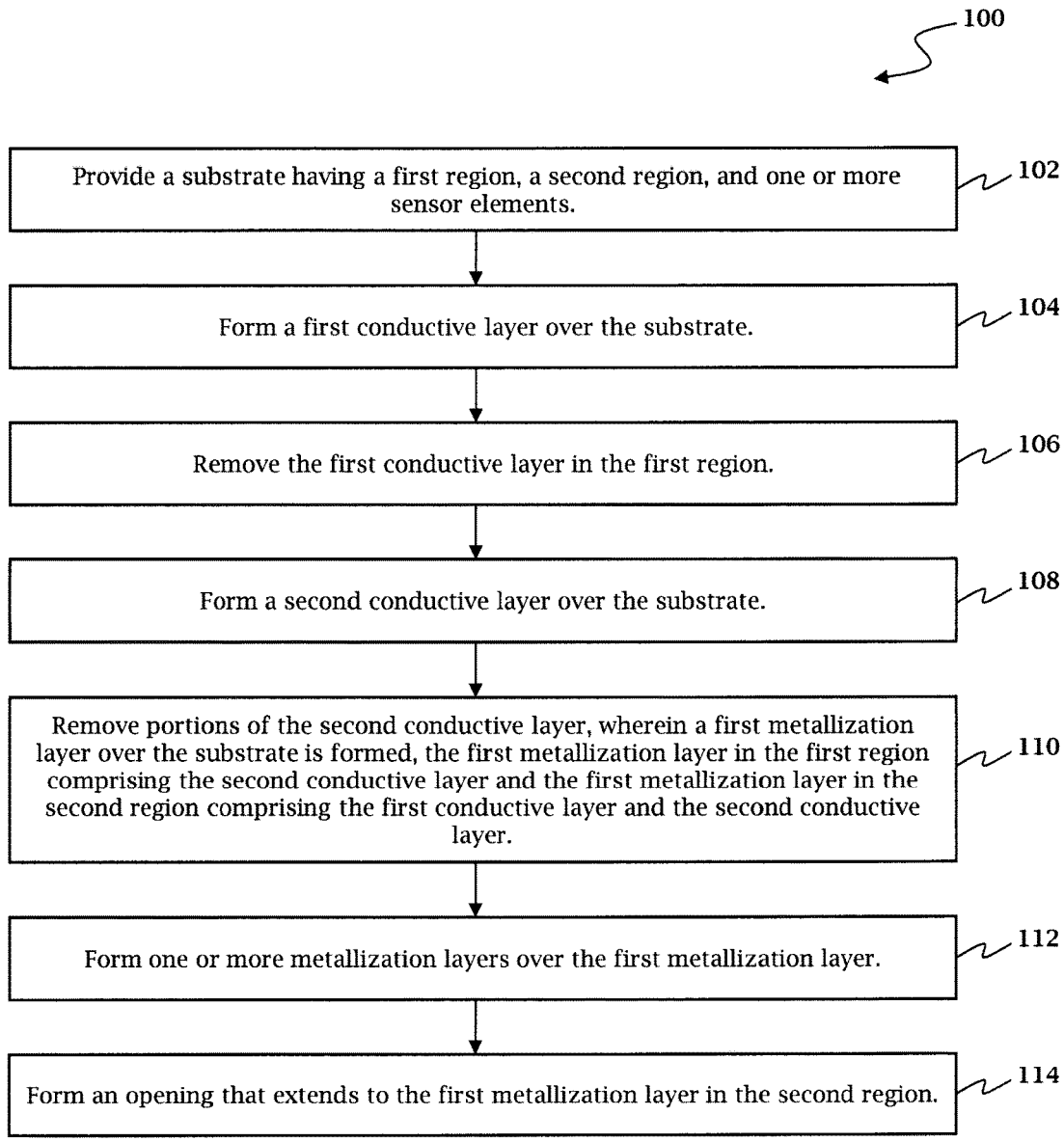
FIG. 1 is a flow chart of a method for fabricating a semiconductor device according to aspects of the present invention.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
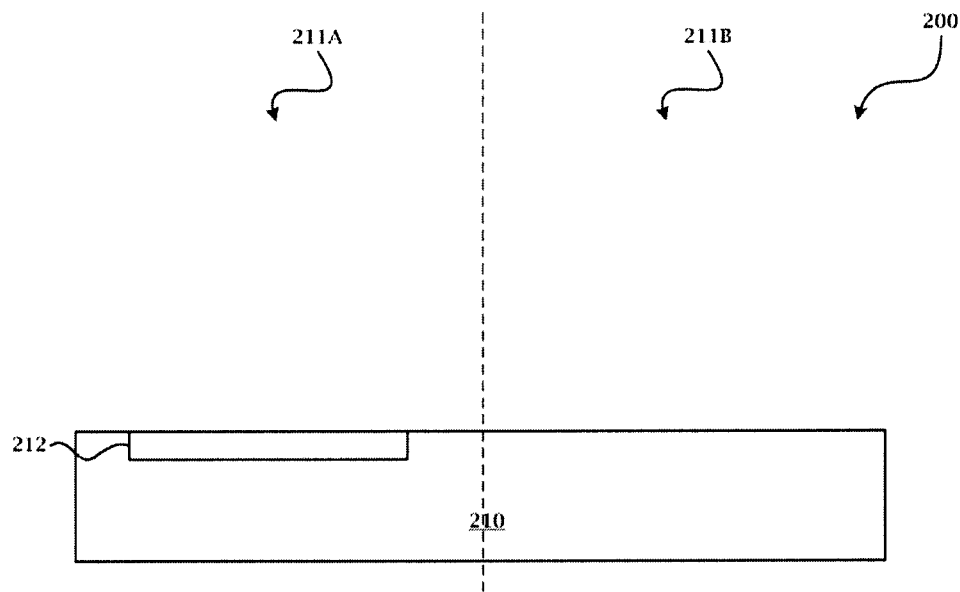
FIGS. 2A-2N are various cross-sectional views of embodiments of a semiconductor device during various fabrication stages according to the method of FIG. 1.
Figure 2B:
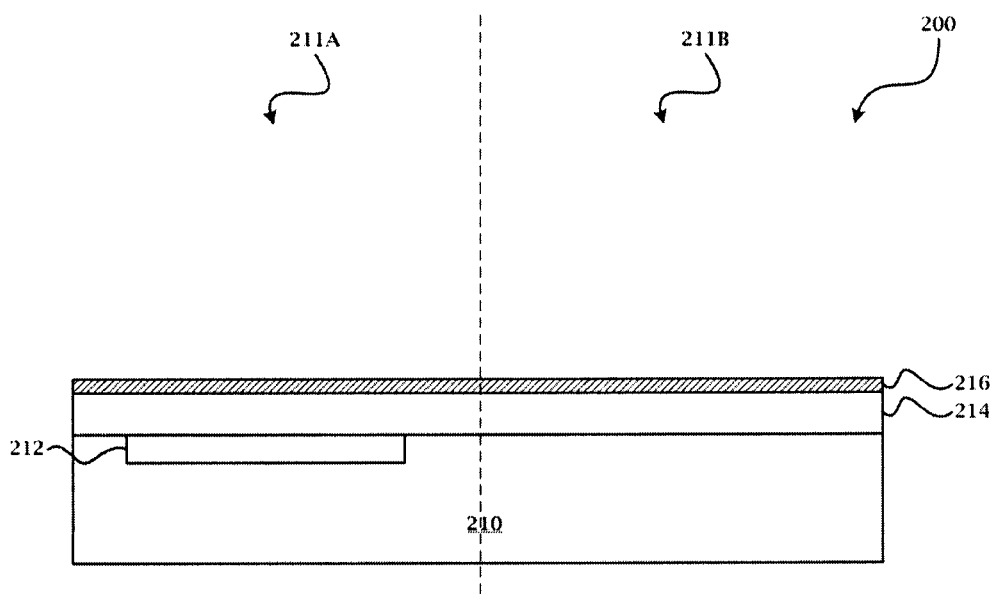
Figure 2C:
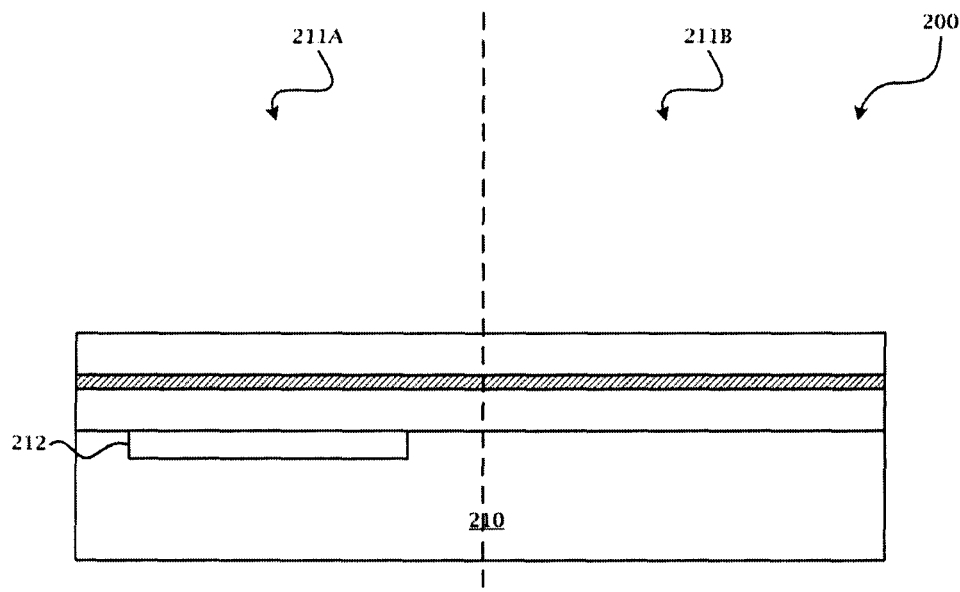
Figure 2D:
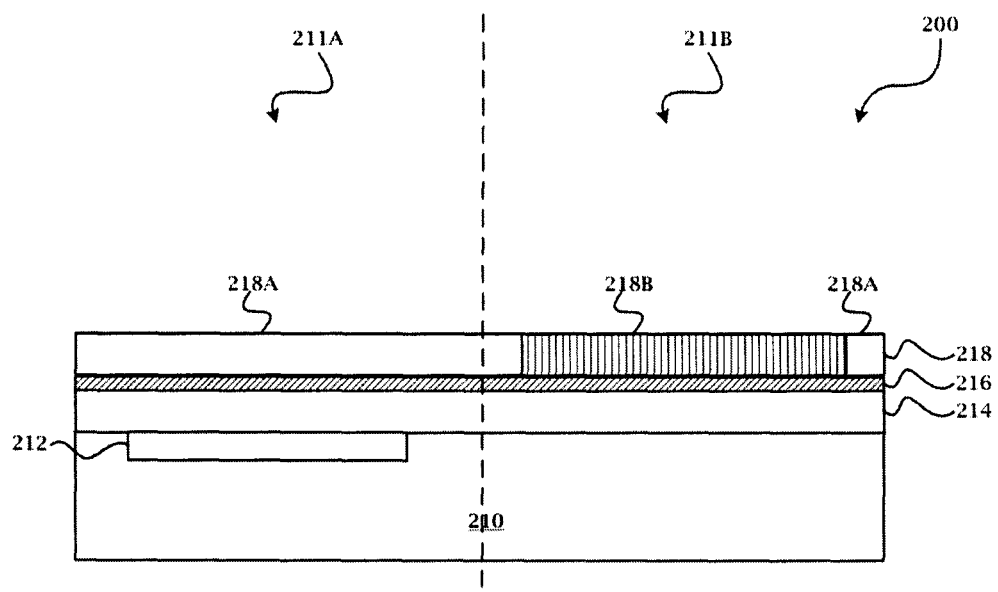
Figure 2E:
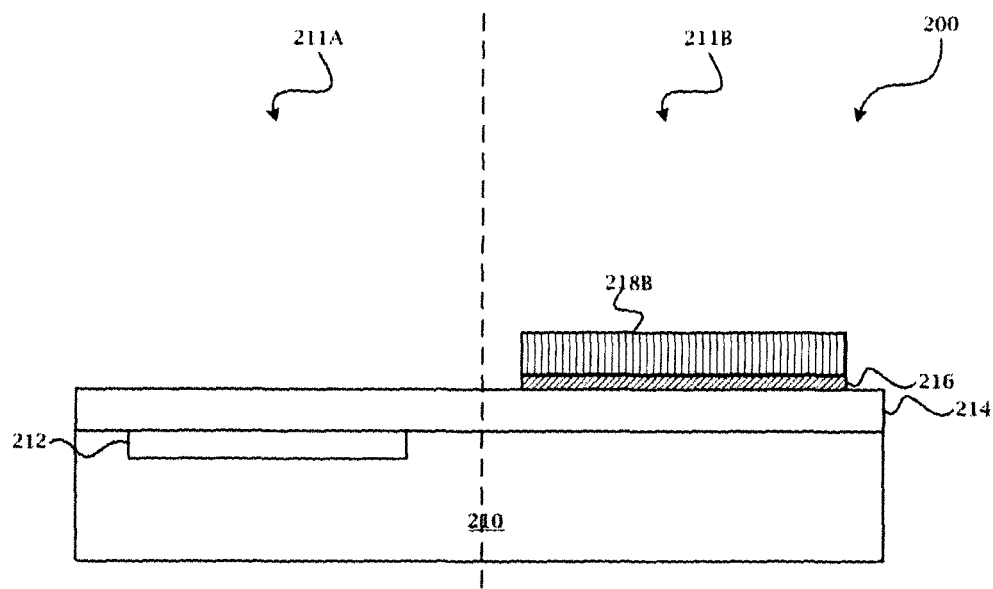
Figure 2F:
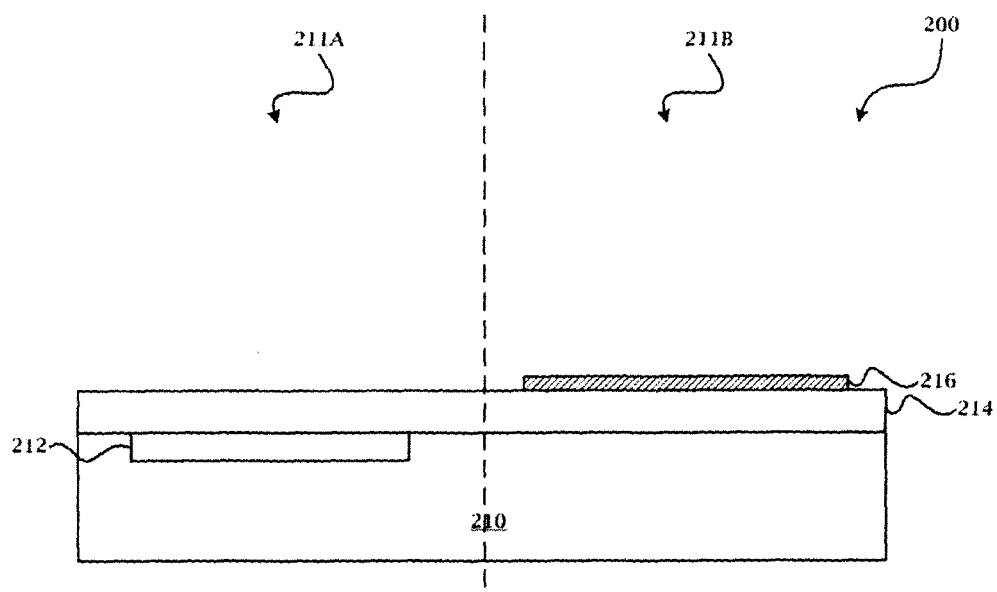
Figure 2G:
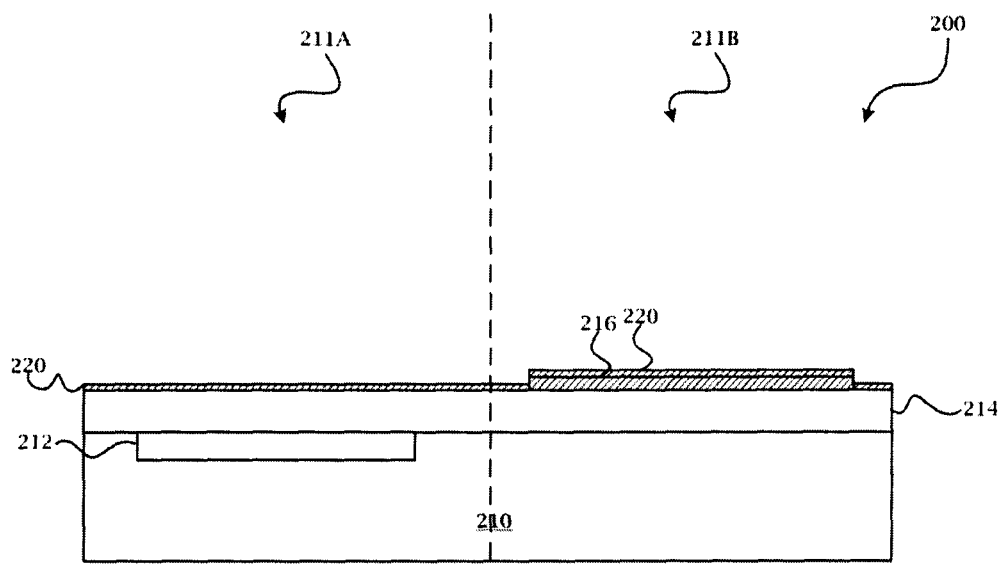
Figure 2H:
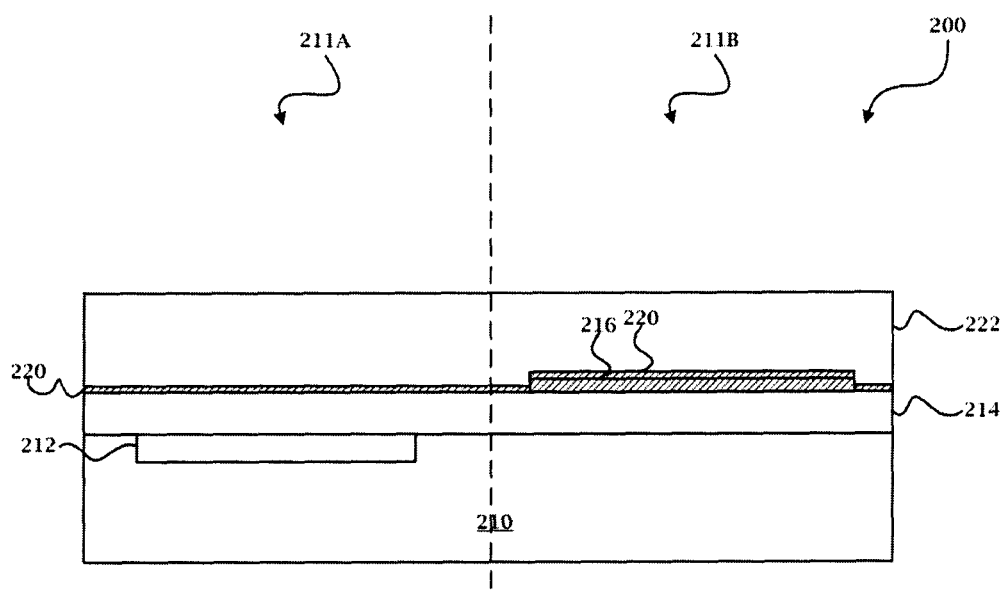
Figure 2I:
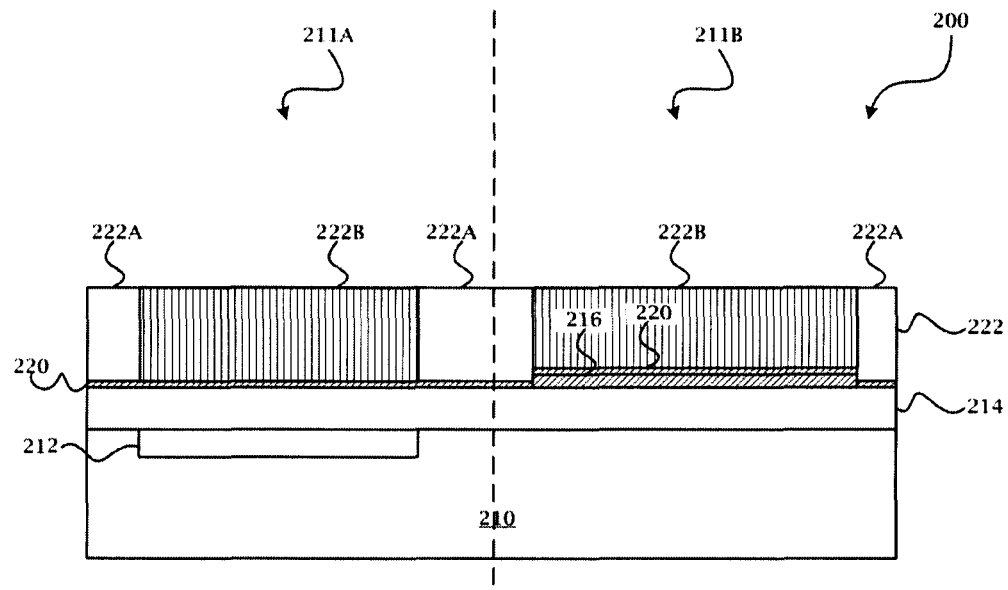
Figure 2J:
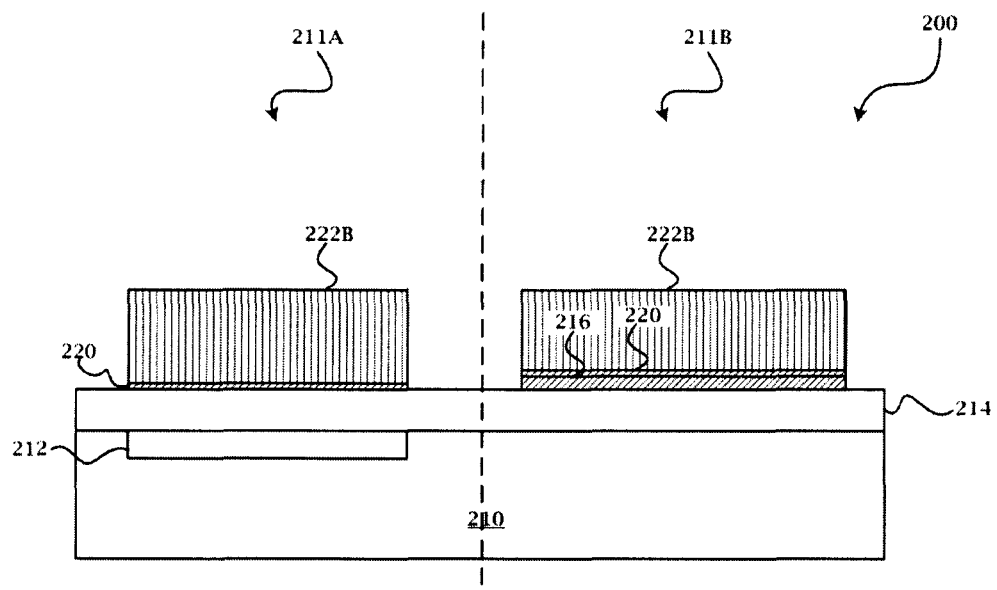
Figure 2K:
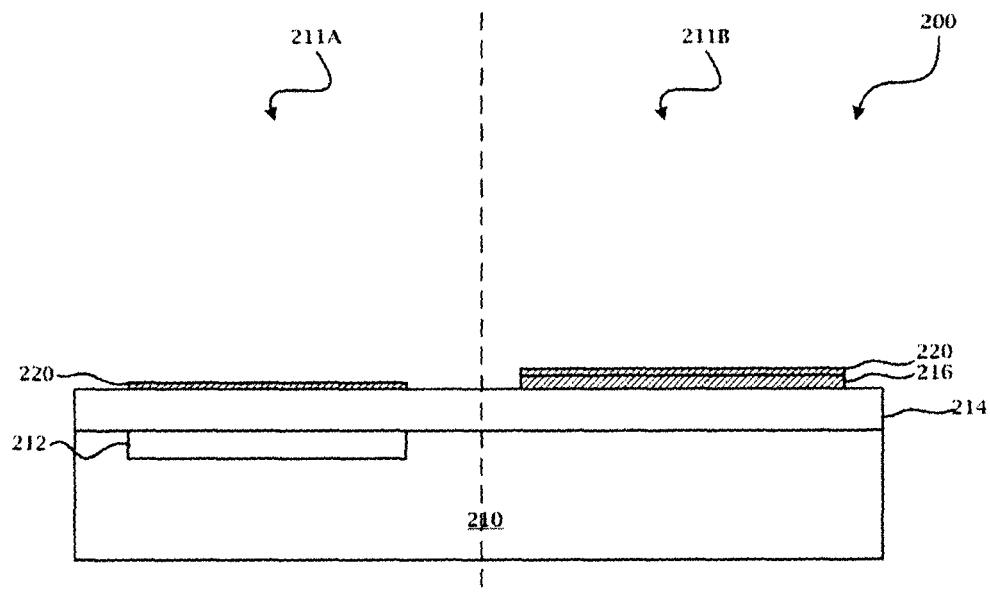
Figure 2L:
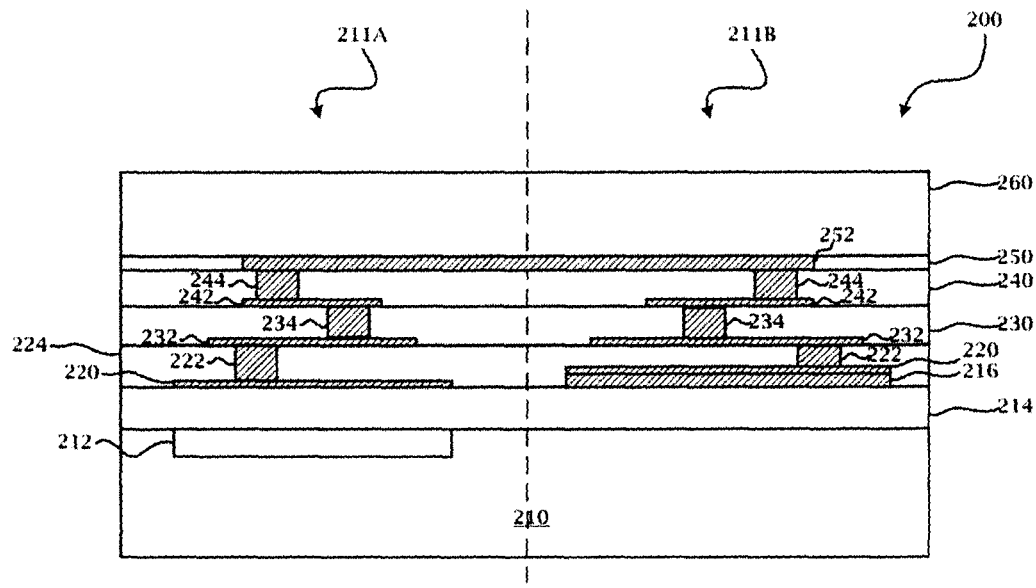
Figure 2M:
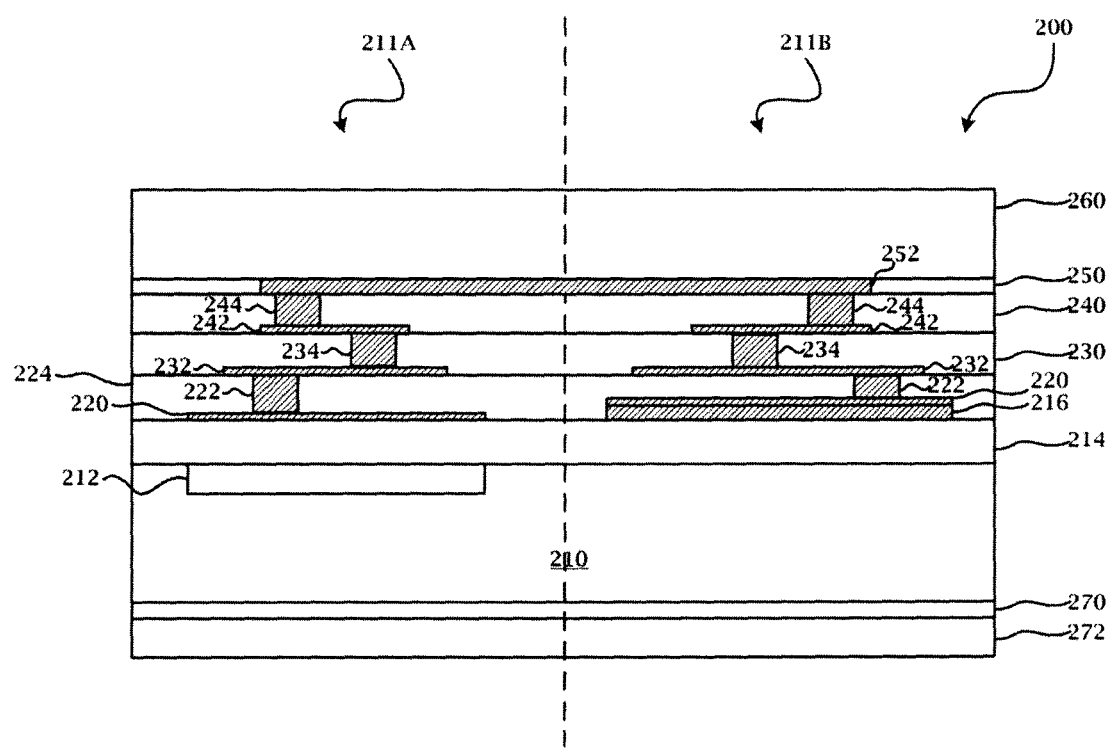
Figure 2N:
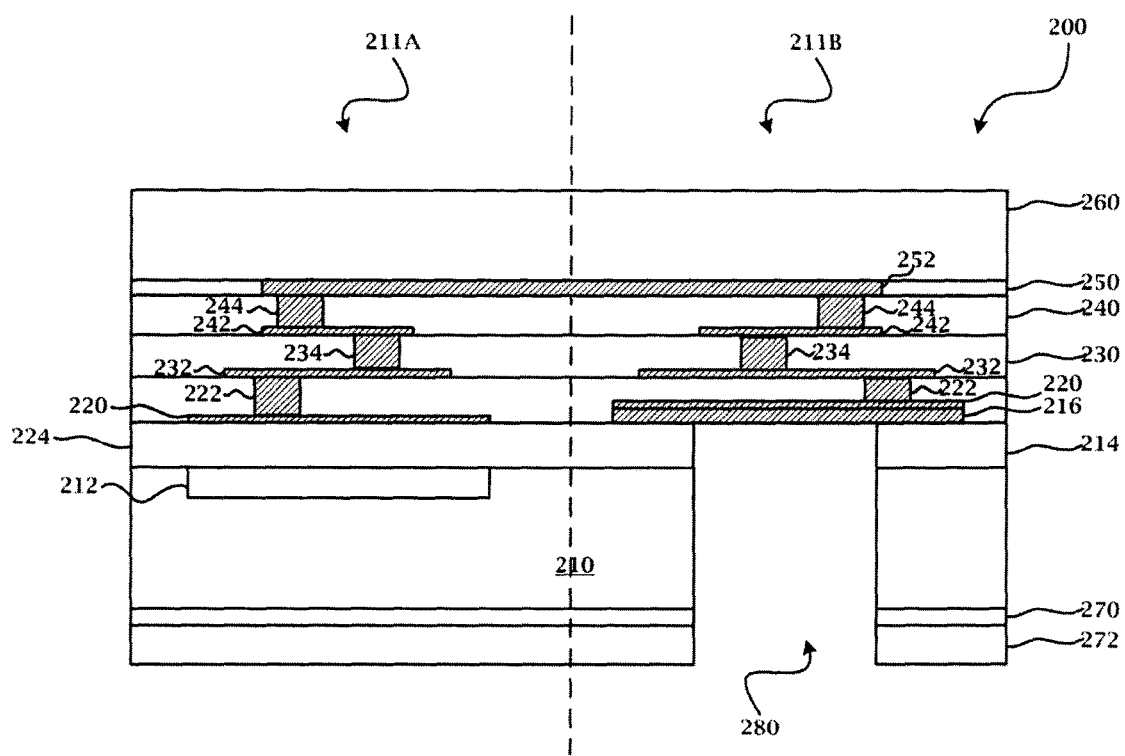

With reference to FIGS. 1 through 2N, a method 100 and a semiconductor device 200 are collectively described below. FIG. 1 is a flow chart of one embodiment of the method 100 for making the semiconductor device 200. FIGS. 2A-2N are various cross-sectional views of the semiconductor device 200 according to one embodiment, in portion or entirety, during various fabrication stages of the method 100. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200. The present embodiment of method 100 and semiconductor device 200 provide improved bonding ability.

Referring to FIGS. 1 and 2A, the method 100 begins at step 102 wherein a substrate 210 having a first region 211A, a second region 211B, and one or more sensor elements 212 is provided. In the present embodiment, the substrate 210 is a semiconductor substrate. The semiconductor substrate 210 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator (SOI) or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. Still, in other examples, the substrate 210 may comprise a non-semiconductor material.

The substrate 210 may include various doping configurations depending on design requirements as known in the art (e.g., p-type substrate regions and/or n-type substrate regions). In some embodiments, the substrate 210 may include doped regions. The doped regions may be doped with p-type or n-type dopants. For example, the doped regions may be doped with p-type dopants, such as boron or $BF_2$; n-type dopants, such as phosphorus or arsenic; and/or combinations thereof. The doped regions may be formed directly on the semiconductor substrate, in a P-well structure, in a N-well structure, in a dual-well structure, or using a raised structure. The substrate 210 may further include one or more lateral isolation features to separate various devices formed on the substrate. The one or more isolation features may utilize isolation technology, such as LOCOS or STI, to define and electrically isolate the various regions. The isolation regions may be formed by any suitable process and may comprise silicon oxide, silicon nitride, silicon oxynitride, fluoride-doped silicate glass, a low-K dielectric material, other suitable materials, and/or combinations thereof.

Further, the substrate 210 comprises a front surface and a back surface. In the present embodiment, the semiconductor device 200 is a backside illuminated sensor device. The semiconductor device 200 is designed to receive light directed towards the back surface of the substrate 210 during applications, eliminating other objects such as gate features and metal lines from obstructing optical paths and maximizing the exposure of the light-sensing region to the illuminated light. The substrate 210 may be thinned such that the light directed through the back surface thereof may effectively reach the sensor elements 212. The substrate 210 includes the first region 211A and the second region 211B, which comprise active and/or passive regions. For example, the first region 211A comprises an integrated circuit device region and/or main chip area, wherein various integrated circuit devices may be formed; and the second region 211B comprises a test region (or area), wherein the test area may be disposed in the scribe line and frame areas of semiconductor device 200 for testing and monitoring during and/or after the fabrication thereof. It is understood that the semiconductor device 200 may comprises a plurality of first and second regions 211A, 211B.

The semiconductor device 200 includes one or more sensor elements 212 formed on the front surface of the substrate 210. In one embodiment, the sensor elements may be disposed over the front surface and extended into the substrate 210. The sensor elements 212 each may comprise a light-sensing region (or photo-sensing region) which may be a doped region having n-type and/or p-type dopants formed in the semiconductor substrate 210 by a method such as diffusion or ion implantation. The sensor elements 212 may include photodiodes, pinned layer photodiodes, non-pinned layer photodiodes, reset transistors, source follower transistors, transfer transistors, select transistors, complimentary metal-oxide-semiconductor (CMOS) image sensors, charged coupling device (CCD) sensors, active pixel sensors, passive pixel sensors, other sensors diffused or otherwise formed in the substrate 210, other active and/or passive features configured and coupled to provide proper functions such as imaging and/or sensing, and/or combinations thereof. As such, the sensor elements 212 may comprise conventional and/or future-developed image sensing devices. The sensor elements 212 may comprise a plurality of pixels disposed in a sensor array or other proper configuration. The plurality of sensor pixels may be designed having various sensor types. For example, one group of sensor pixels may be CMOS image sensors and another group of sensor pixels may be passive sensors. Moreover, the sensor elements 212 may comprise color image sensors and/or monochromatic image sensors. Additional circuitry and input/outputs are typically provided adjacent to the sensor elements 212 for providing an operation environment for the sensor elements 212 and for supporting external communications with the sensor elements 212. For example, the sensor elements 212 may further comprise or be coupled to components such as an electric circuit so that the sensor elements 212 are operable to provide a proper response to illuminated light. In some embodiments, each of the sensor elements 212 may be configured to correspond with specific light wavelengths, such as a sensor element for sensing a red light wavelength, a sensor element for sensing a green light wavelength, and a sensor element for sensing a blue light wavelength.

Conventional processing continues by forming a plurality of dielectric layers and a plurality of conductive features including a plurality of metal structures coupled to a plurality of contact and/or via structures over the front surface of the substrate. The plurality of metal structures and the plurality of contact/via structures may be formed in an integrated process, such as a damascene process or a dual damascene process, and further, vertical and horizontal features may be formed in various processes, such as photolithography and etching processes. The plurality of metal structures are typically formed in N metallization layers over the front surface of the substrate, where the metal structures formed directly above the front surface of the substrate are formed in the metal one metallization layer, M1, and the topmost metal structures are formed in the topmost metallization layer, M(N).

Then, one or more bonding pads may be formed and coupled to at least one of the metallization layers in a testing region of the substrate, such as the M1 metallization layer. The metallization layer that the bonding pad is coupled to typically comprises a uniform thickness in the testing region (e.g., second region 211B) and the integrated circuit device region (e.g., first region 211A). However, to achieve improved bonding ability, the bonding pad desirably couples to a metallization layer with an increased thickness as compared to the thickness of the metallization layers in the integrated circuit device regions. Several approaches are utilized to achieve improved bonding ability. In one approach, the semiconductor device is etched back to the M1 metallization layer in the testing region; an additional conductive layer is deposited over the M1 metallization layer in the testing region, wherein the M1 metallization layer in the testing region then comprises the M1 metallization layer material found in the integrated circuit device region plus the additional conductive layer; and a bonding wire extending from the back surface of the semiconductor device to the M1 metallization layer in the testing region is formed. This approach often requires at least two additional masks to pattern and etch the testing regions, resulting in increased costs and increased processing difficulties. A second approach involves etching the semiconductor device back until a metallization layer with an increased thickness is reached. For example, the process may etch back to an inter-metallization layer, such as a M2 metallization layer or a topmost M(N) metallization layer. However, the inter-metallization and/or topmost metallization layers are not necessarily thick enough, and the likelihood of device failure increases since a bonding wire may easily touch the side-wells and induce leakage from the substrate. Further, the second approach is more difficult, presents increased costs, and may require multiple etching processes. A third approach provides a uniform M1 metallization layer with an increased thickness in both the testing region and the integrated circuit device region; however, the increased thickness in the integrated circuit device region decreases sensor device performance, which may result from stray capacitance.

Accordingly, the present embodiment provides a method wherein the metallization layer in the testing area (e.g., second region 211B) is easily made thicker than the metallization layer in the integrated circuit device area (e.g., first region 211A). The thickness of the M1 metallization layer in the testing region is increased, while the M1 metallization layer in the integrated circuit device region remains its original thickness. Specifically, in the present embodiment, the M1 metallization layer in the second region 211B is thicker than the M1 metallization layer in the first region 211A. The disclosed embodiments provide one or more of the following advantages: (1) improved backside illuminated sensor package yield; (2) improved backside illuminated sensor bonding ability; (3) improved sensor device (i.e., pixel) performance; (4) decreased cost; (5) easily integrated into existing device processing; and (6) easily extends to next generation processes.

Referring to FIG. 1 and FIGS. 2B-2K, a first metallization layer M1 is formed over the front surface of the substrate 210. In the present embodiment, an inter-layer (or level) dielectric (ILD) layer 214 is formed over the front surface of the substrate 210 as illustrated in FIG. 2B. The ILD layer 214 comprises a low-K (LK), ultra low-K (ULK), extra low-K (ELK), and/or XLK material. The material classification is based upon capacitance or k value, with LK usually referring to those materials with a k between about 3.1 to 2.7, ULK usually referring to those materials with a k between about 2.7 to 2.4, ELK usually referring to those materials with a k between about 2.3 to 2.0, and XLK referring to those materials which typically have a k value less than about 2.0. The LK, ULK, ELK, and/or XLK dielectric materials may comprise silicon oxide, silicon nitride, silicon oxynitride, spin-on glass (SOG), fluorinated silica glass (FSG), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, other proper porous polymeric materials, other suitable dielectric materials, and/or combinations thereof. The ILD layer 214 may be formed by any suitable process, such as spin-on coating, chemical vapor deposition (CVD), physical vapor deposition (PVD), atomic layer deposition (ALD), high density plasma CVD (HPCVD), metal organic CVD (MOCVD), remote plasma CVD (RPCVD), plasma enhanced CVD (PECVD), sputtering, plating, other suitable processes, and/or combinations thereof. In some embodiments, the ILD layer 214 may include a high density plasma (HDP) dielectric material and/or a high aspect ratio process (HARP) dielectric material. It is understood that the ILD layer 214 may comprise one or more dielectric materials and/or one or more dielectric layers.

At step 104, a first conductive layer 216 is formed over the front surface of the substrate 210 in the first and second regions 211A, 211B, and in the present embodiment, over the ILD layer 214 to any suitable thickness. The first conductive layer 216 may comprise any suitable material, such as aluminum, copper, tungsten, titanium, tantulum, titanium nitride, tantalum nitride, nickel silicide, cobalt silicide, TaC, TaSiN, TaCN, TiAl, TiAlN, other proper conductive materials, and/or combinations thereof. The first conductive layer 216 may be formed by any suitable process, such as spin-on coating, CVD, PVD, ALD, HPCVD, MOCVD, RPCVD, PECVD, sputtering, plating, other suitable processes, and/or combinations thereof. It is understood that the first conductive layer 216 may comprise one or more materials.

Referring to FIG. 1 and FIGS. 2C-2F, at step 106, the first conductive layer 216 is removed from the first region 211A. For example, in the present embodiment, removing the first conductive layer 216 in the first region 211A comprises forming a photoresist layer 218 over the semiconductor device 200 as shown in FIG. 2C. The photoresist layer 218 is patterned by a conventional photolithography process and/or processes to create one or more first portions 218A and one or more second portions 218B as shown in FIG. 2D. The first portions 218A are unprotected portions. The second portions 218A are protected portions that may define a portion of the first metallization layer in the second region 211B, such as a portion of the bonding pad area. Then, the first, unprotected portions 218A of the photoresist layer 218 are etched away and removed, along with the portions of the first conductive layer 216 lying under the first, unprotected portions 218A of the photoresist layer 218. As evident from FIG. 2E, the first conductive layer 216 remains only under the second portions 218B of the photoresist layer 218, defining a portion of the first metallization layer in the second region 211B, which defines the bonding pad area in the testing region of the semiconductor device 200. Subsequently, the photoresist layer 218 (i.e., the remaining second portions 218B) may be removed. The first conductive layer 216 defines the bonding pad area in the second region 211B, the testing region, as shown in FIG. 2F.

It is understood that the first conductive layer 216 may be removed from the first region 211A using alone or in combination any of the photolithography and/or etching processes described herein. The photolithography patterning process may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching process may include dry etching, wet etching, and/or other etching methods (e.g., reactive ion etching). The etching process may also be either purely chemical (plasma etching), purely physical (ion milling), and/or combinations thereof. In some embodiments, a hard mask layer may be utilized to pattern and etch the first conductive layer 216.

At step 108, a second conductive layer 220 is formed over the substrate 210 in the first and second regions 211A, 211B, and in the present embodiment, over the first conductive layer 216. See, for example, FIG. 2G. The second conductive layer 220 may comprise any suitable material, such as aluminum, copper, tungsten, titanium, tantulum, titanium nitride, tantalum nitride, nickel silicide, cobalt silicide, TaC, TaSiN, TaCN, TiAl, TiAlN, other proper conductive materials, and/or combinations thereof. The second conductive layer 216 may be formed by any suitable process, such as spin-on coating, CVD, PVD, ALD, HPCVD, MOCVD, RPCVD, PECVD, sputtering, plating, other suitable processes, and/or combinations thereof. It is understood that the second conductive layer 220 may comprise one or more materials. In the present embodiment, the second conductive layer 220 comprises the same material as the first conductive layer 216, but it is understood that, in alternate embodiments, the first conductive layer 216 and the second conductive layer 220 may comprise different materials. The second conductive layer 220 is any suitable thickness.

Referring to FIG. 1 and FIGS. 2H-2K, at step 110, portions of the second conductive layer 220 are removed in the first and second regions 211A, 211B, wherein the first region 211A includes the first metallization layer M1 comprising the second conductive layer 220 and the second region 211B includes the first metallization layer M1 comprising the first conductive layer 216 and the second conductive layer 220. For example, in the present embodiment, removing portions of the second conductive layer 220 in the first and second regions 211A, 211B comprises forming a photoresist layer 222 over the semiconductor device 200 as shown in FIG. 2H. The photoresist layer 222 is patterned by a conventional photolithography process and/or processes to create one or more first portions 222A and one or more second portions 222B as shown in FIG. 2I. The first portions 222A are unprotected portions. The second portions 222B are protected portions that define the first metallization layer in the first region 211A (i.e., define a M1 layer of the integrated circuit device area) and a portion of the first metallization layer in the second region 211B (e.g., a portion of the bonding pad area). Then, the first, unprotected portions 222A of the photoresist layer 222 are etched away and removed, along with the portions of the second conductive layer 220 lying under the first, unprotected portions 222A.

It is understood that the portions of the second conductive layer 220 may be removed from the first and second regions 211A, 211B using alone or in combination any of the photolithography and/or etching processes described herein. The photolithography patterning process may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching process may include dry etching, wet etching, and/or other etching methods (e.g., reactive ion etching). The etching process may also be either purely chemical (plasma etching), purely physical (ion milling), and/or combinations thereof. In some embodiments, a hard mask layer may be utilized to pattern and etch the second conductive layer 220.

As illustrated in FIG. 2J, the second conductive layer 220 remains only under the second portions 222B of the photoresist layer 222, defining the first metallization layer M1 in the first and second regions 211A, 211B. Subsequently, the photoresist layer 222 (i.e., the remaining second portions 222B) may be removed. Referring to FIG. 2K, the first metallization layer M1 of the semiconductor device 200 is defined. The first metallization layer M1 in the first, integrated circuit device region 211A comprises the second conductive layer 220, and the first metallization layer M1 in the second, testing region 211B comprises the first conductive layer 216 and the second conductive layer 220. The thickness of the first metallization layer M1 in the first region 211A comprising the second conductive layer 220 is less than the thickness of the first metallization layer M1 in the second region 211B comprising the first conductive layer 216 and the second conductive layer 220. Thus, the present embodiment provides the semiconductor device 200 with the first metallization layer M1 in the second, testing region 211B (wherein a bonding pad may be formed) with an increased thickness while maintaining the thickness of the first metallization layer M1 in the first, integrated circuit device region 211A. This is accomplished utilizing only one mask of the second, testing region 211B and one photolithography patterning and etching process.

Referring to FIG. 1 and FIGS. 2L-2N, conventional processing may follow. For example, at step 112, one or more metallization layers are formed over the first metallization layer M1. The one or more metallization layers comprise a plurality of metal structures 232, 242, 252. In the present embodiment, the semiconductor device 200 comprises four metallization layers, M1 through M4, metal structures comprising first and second conductive layers 216, 220 being M1, . . . metal structures 242 being M(n−1) or M3, and metal structures 252 being the topmost metal structure, M(N), or M4. Although only metal one (M1) through metal four (M4) metallization layers are illustrated, it is understood that the semiconductor device 200 may comprise any number of metallization layers, dependent on device complexity and design of the particular device. For example, in some embodiments, the semiconductor device 200 may comprise metallization layers M1 through M9. A plurality of contact and/or via structures 222, 234, 244 and one or more ILD layers 224, 230, 240, 250 are formed over the substrate 210. The ILD layers 224, 230, 240, 250 separate and isolate each of the metallization layers and contact and/or via structures 222, 234, 244 from one another. The plurality of contact and/or via structures 222, 234, 244 may be configured to couple the substrate 210 to the metallization layers and/or metal structures and/or configured to couple one metal structure to another metal structure, such as metal structure 232 to metal structure 242, or metallization layer M2 to metallization layer M3, etc.

The metal structures 232, 242, 252; contact and/or via structures 222, 234, 244; and ILD layers 224, 230, 240, 250 are formed by any suitable processes, such as the processes described herein. The metal structures 232, 242, 252 may be similar to the first and second conductive layers 216, 220. The contact/via structures 222, 234, 244 may comprise any suitable material, such as aluminum, copper, tungsten, titanium, tantulum, titanium nitride, tantalum nitride, nickel silicide, cobalt silicide, TaC, TaSiN, TaCN, TiAl, TiAlN, other proper conductive materials, and/or combinations thereof. It is understood that each of the metal structures 232, 242, 252 and each of the conductive/via structures 222, 234, 244 may comprise the same materials and/or different materials. The ILD layers 224, 230, 240, 250 may comprise materials similar to ILD layer 214, such as silicon oxide, silicon nitride, silicon oxynitride, SOG, FSG, SiCOH, Black Diamond® (Applied Materials of Santa Clara, Calif.), Xerogel, Aerogel, amorphous fluorinated carbon, Parylene, BCB, Flare, SiLK (Dow Chemical, Midland, Mich.), polyimide, other proper porous polymeric materials, other suitable dielectric materials, and/or combinations thereof. It is understood that each of the ILD layers 224, 230, 240, 250 may comprise one or more dielectric materials and/or one or more dielectric layers. It is further understood that the ILD layers 224, 230, 240, 250 may comprise the same materials and/or different materials.

As shown in FIG. 2L, a carrier wafer 260 may be bonded to the front surface of the substrate 210. The carrier wafer 260 may provide protection for the various features formed on the front surface of the substrate 210. The carrier wafer 260 may also provide mechanical strength and support. The carrier wafer 260 may comprise any suitable material, such as silicon and/or glass. As discussed above, the semiconductor device 200 includes sensor elements 212 that are formed on the front surface of the substrate 210. Accordingly, the substrate 210 may be processed to be made thin enough to allow the radiation incident on the back surface of the substrate 210 to reach the sensor elements 212. The substrate 210 may be thinned down from the back surface by various techniques as know in the art.

Then, referring to FIGS. 2M-2N, processing of the back surface of the substrate 210 may be performed. For example, various layers 270, 272 (e.g., oxide layers) may be formed over the back surface of the substrate 210; and at step 114, an opening 280 is formed that extends to the first metallization layer M1 in the second, testing region 211B. The various layers may comprise interfacial layers, dielectric layers, diffusion/barrier layers, conductive layers, capping layers, other suitable layers, and/or combinations thereof. The opening 280 may be formed in the back surface of the substrate 210 using any suitable process, such as the processes described herein. For example, a patterned photoresist layer may be applied to the back surface of the substrate 210 and the opening 280 may be etched there-through. In the present embodiment, the opening 280 is positioned directly over the first metallization layer M1 of the second, testing region 211B comprising the first and second conductive layers 216, 220 as illustrated in FIG. 2N. Thus, the first metallization layer M1 of the second, testing region 211B comprising the first and second conductive layers 216, 220 may be probed, or otherwise accessed, by a testing probe. Such access allows testing measurements to be performed. In some embodiments, a bonding wire may be formed in the opening 280. The bonding wire may comprise a barrier/diffusion layer and/or a conductive layer. The bonding wire may further comprise any suitable material, such as aluminum, copper, tungsten, titanium, tantalum, titanium nitride, tantalum nitride, nickel silicide, cobalt silicide, TaC, TaSiN, TaCN, TiAl, TiAlN, other proper conductive materials, and/or combinations thereof.

It is understood that additional features may be formed over the back surface of the substrate 210. For example, the semiconductor device 200 may further comprises a color filter layer that supports several different color filters (e.g., red, green, and blue). The color filters may correspond to the various sensor devices 212 on the substrate 210. The semiconductor device 200 may further comprise a plurality of lenses, such as microlenses, in various positional arrangements with sensor devices 212 and/or color filters, such that incident light may be focused on the light-sensing regions. Other proper imaging features may further be formed on the back surface of the substrate 210.

In summary, the disclosed embodiments provide a method for fabricating a backside illuminated sensor device comprising providing a substrate having a front surface and a back surface; forming one or more sensor elements on the front surface of the substrate; and forming one or more metallization layers over the front surface of the substrate, wherein a thickness of a first metallization layer in a testing area/region is thicker than the thickness of the first metallization layer in an integrated circuit device area/region. The method provides one mask and one patterning/etching step to increase the thickness of the first metallization layer in the testing region, while maintaining the thickness of the first metallization layer in the integrated circuit device region at an original thickness. The disclosed embodiments improve bonding ability.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a front surface, a back surface, a first region, a second region, and one or more sensor elements, wherein the one or more sensor elements are located on the first region;
   an interlayer dielectric (ILD) layer on the substrate;
   a first metal layer on the ILD layer,
   wherein the first metal layer comprises a first conductive layer directly on the ILD layer and a second conductive layer directly on the first conductive layer in the second region, and the first metal layer comprises the second conductive layer directly on the ILD layer in the first region, wherein a bottom surface of the first conductive layer in the second region is coplanar with a bottom surface of the second conductive layer in the first region,
   wherein the second region comprises a testing area, and
   wherein a thickness of the first metal layer in the first region is less than another thickness of the first metal layer in the second region;
   a first via directly on the second conductive layer in the first region; and
   a second via directly on the second conductive layer in the second region, wherein a top surface of the second via is coplanar with a top surface of the first via.

2. The semiconductor device of claim 1, further comprising an opening that extends from the back surface of the substrate to the first metal layer in the second region.

3. The semiconductor device of claim 1, further comprising a carrier wafer on the front surface of the substrate.

4. The semiconductor device of claim 1, wherein the first and second conductive layers comprise the same material.

5. A semiconductor device, comprising:
   a substrate having a front surface and a back surface;
   an interlayer dielectric (ILD) layer on the substrate;
   a first metal layer in a first region of the substrate, the first metal layer comprising a third conductive layer in direct contact with the ILD layer;
   a second metal layer in a second region of the substrate, the second metal layer comprising a first conductive layer directly on the ILD layer and a second conductive layer directly on the first conductive layer, wherein a bottom surface of the first conductive layer is coplanar with a bottom surface of the third conductive layer, wherein a top surface of the first conductive layer is planar and coextensive with the second conductive layer, wherein the first metal layer and the second metal layer are both completely within another ILD layer; and
   one or more sensor elements on the first region of the substrate that are proximate to the back surface of the substrate, wherein the second region comprises a testing area, and wherein a thickness of the third conductive layer is less than another thickness of the first and second conductive layers.

6. The semiconductor device of claim 5, further comprising an opening that extends from the back surface of the substrate to the first conductive layer in the second region.

7. The semiconductor device of claim 5, further comprising a carrier wafer on the front surface of the substrate.

8. A semiconductor device, comprising:
   a substrate having a front surface and a back surface;
   an interlayer dielectric (ILD) layer on the substrate;
   a first metal layer on the ILD layer having a first thickness in a first region of the substrate and a second thickness in a second region of the substrate, wherein the second thickness is greater than the first thickness, wherein the first metal layer in the second region comprises a first conductive layer directly on the ILD layer and a second conductive layer directly on the first conductive layer, and the first metal layer in the first region comprises the second conductive layer directly on the ILD layer, wherein a bottom surface of the first conductive layer in the second region is coplanar with a bottom surface of the second conductive layer in the first region, wherein the first conductive layer is free of dielectric material and there is no dielectric material between the first conductive layer and the second conductive layer in the second region, and wherein the second region comprises a testing area; and one or more sensor elements on the first region of the substrate.

9. The semiconductor device of claim 8, further comprising an opening that extends from the back surface of the substrate to the first metal layer in the second region.

10. The semiconductor device of claim 8, wherein the one or more sensor elements are proximate to the back surface of the substrate.

11. The semiconductor device of claim 8, wherein the first and second conductive layers comprise the same material.

12. The semiconductor device of claim 1, wherein the first conductive layer is free of dielectric material and there is no dielectric material between the first conductive layer and the second conductive layer in the second region.

13. The semiconductor device of claim 1, wherein the first conductive layer and the second conductive layer are coextensive in the second region.

14. The semiconductor device of claim 1, wherein the first conductive layer and the second conductive layer comprise different materials.

15. The semiconductor device of claim 5, further comprising:
a first via directly on the third conductive layer; and
a second via directly on the second conductive layer, wherein a top surface of the second via is substantially coplanar with a top surface of the first via.

16. The semiconductor device of claim 5, further comprising:
a third ILD layer in direct contact with the another ILD layer, wherein the third ILD layer and the another ILD layer comprise different dielectric materials.

17. The semiconductor device of claim 5, wherein the first conductive layer is free of dielectric material and there is no dielectric material between the first conductive layer and the second conductive layer.

18. The semiconductor device of claim 8, further comprising:
a first via directly on the second conductive layer in the first region; and
a second via directly on the second conductive layer in the second region, wherein a top surface of the second via is coplanar with a top surface of the first via.

19. The semiconductor device of claim 18, wherein the first via and the second via are both completely embedded in a same dielectric layer.

20. The semiconductor device of claim 8, wherein the first conductive layer and the second conductive layer comprise different materials.

* * * * *